(12) United States Patent
Pawlak

(10) Patent No.: US 9,166,025 B1
(45) Date of Patent: Oct. 20, 2015

(54) METHODS OF FORMING A NANOWIRE DEVICE WITH A GATE-ALL-AROUND-CHANNEL CONFIGURATION AND THE RESULTING NANOWIRE DEVICE

(71) Applicant: GLOBALFOUNDRIES Inc., Grand Cayman (KY)

(72) Inventor: Bartlomiej Jan Pawlak, Leuven (BE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/304,096

(22) Filed: Jun. 13, 2014

(51) Int. Cl.
H01L 29/06 (2006.01)
H01L 29/66 (2006.01)
H01L 29/10 (2006.01)
H01L 29/78 (2006.01)

(52) U.S. Cl.
CPC ...... *H01L 29/66818* (2013.01); *H01L 29/0673* (2013.01); *H01L 29/1033* (2013.01); *H01L 29/6681* (2013.01); *H01L 29/7854* (2013.01)

(58) Field of Classification Search
CPC ........ H01L 29/0665–29/0676; H01L 29/1033; H01L 29/42392; H01L 29/66484; H01L 29/7831; H01L 29/78645; H01L 29/785–29/7854
See application file for complete search history.

(56) References Cited

U.S. PATENT DOCUMENTS

| | | | |
|---|---|---|---|
| 8,030,716 B2 | 10/2011 | Park et al. | |
| 2003/0042568 A1* | 3/2003 | Jang | 257/510 |
| 2009/0212341 A1* | 8/2009 | Cheng et al. | 257/316 |
| 2013/0026451 A1* | 1/2013 | Bangsaruntip et al. | 257/24 |

\* cited by examiner

*Primary Examiner* — Bryan Junge
(74) *Attorney, Agent, or Firm* — Amerson Law Firm, PLLC

(57) ABSTRACT

One illustrative method includes forming at least one layer of epi semiconductor cladding material around a fin and patterning the cladding material and the fin, thereby resulting in the patterned fin being positioned under the patterned cladding material, wherein the patterned cladding material has an upper portion and a plurality of substantially vertically oriented legs extending downward from the upper portion. The method also includes selectively removing the patterned fin relative to the patterned cladding material, forming a sacrificial gate structure all around at least a portion of the cladding material, forming an epi semiconductor source/drain region on each of the substantially vertically oriented legs, and forming a final gate structure around at least a portion of the cladding material.

27 Claims, 17 Drawing Sheets

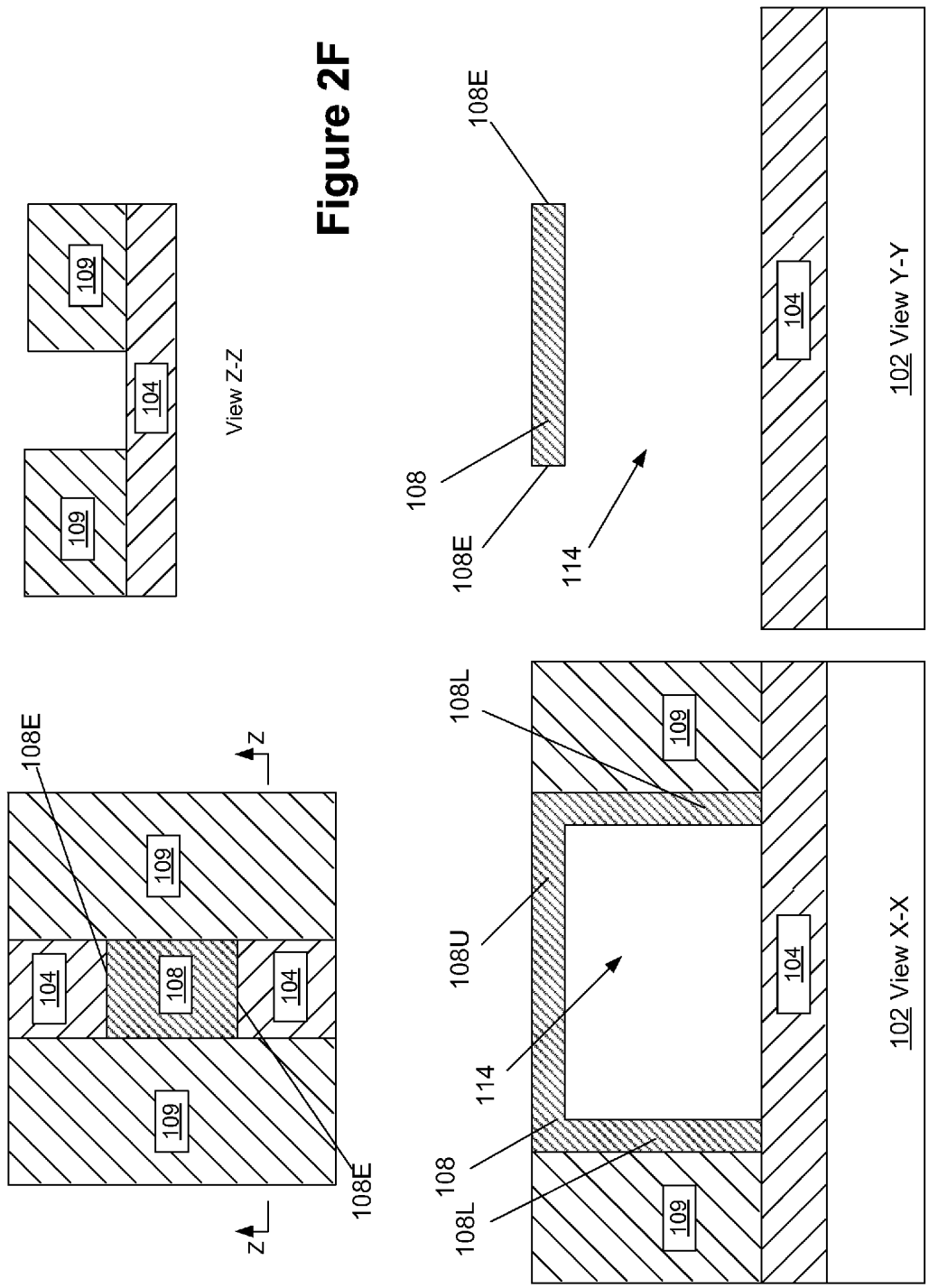

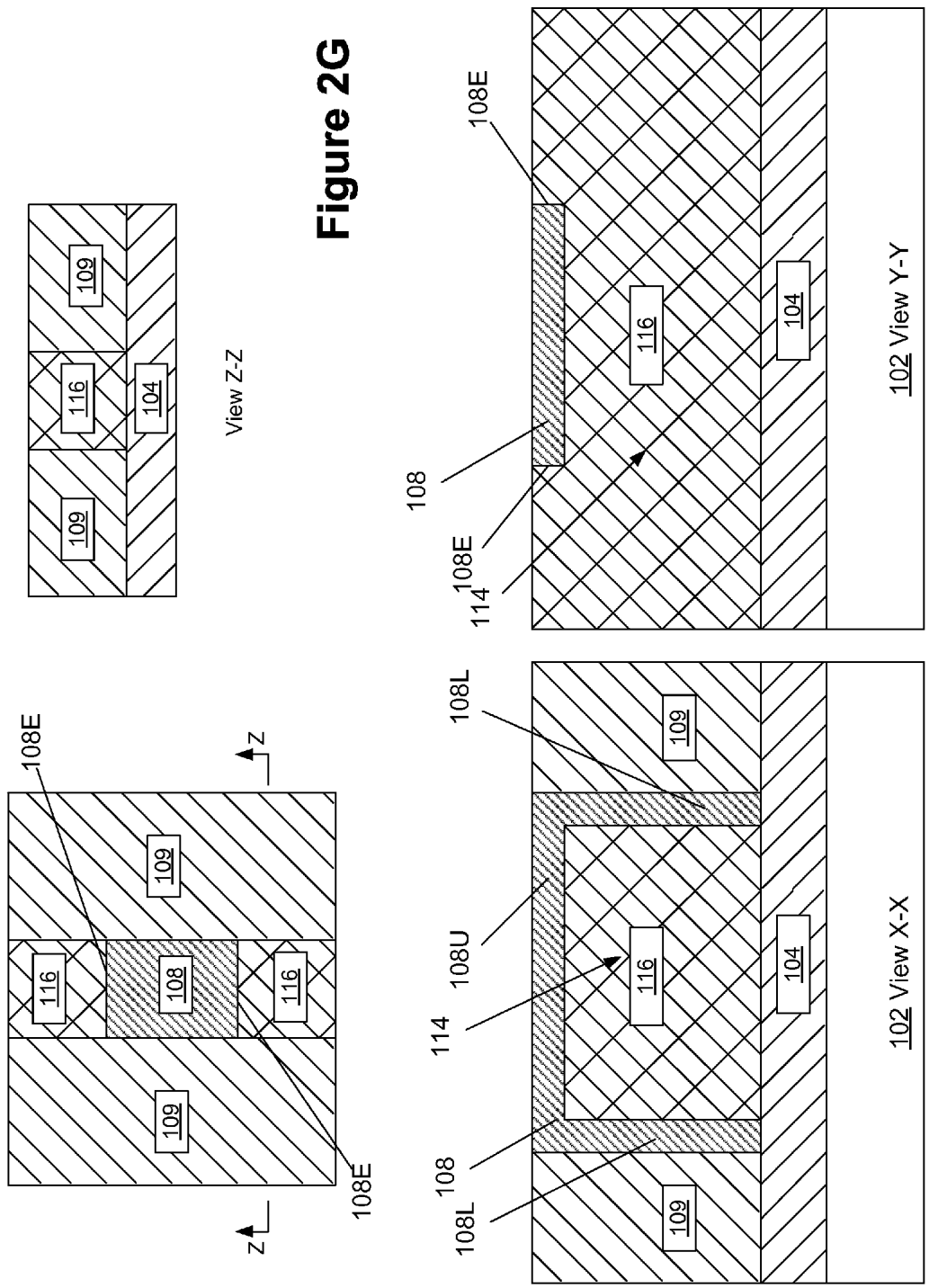

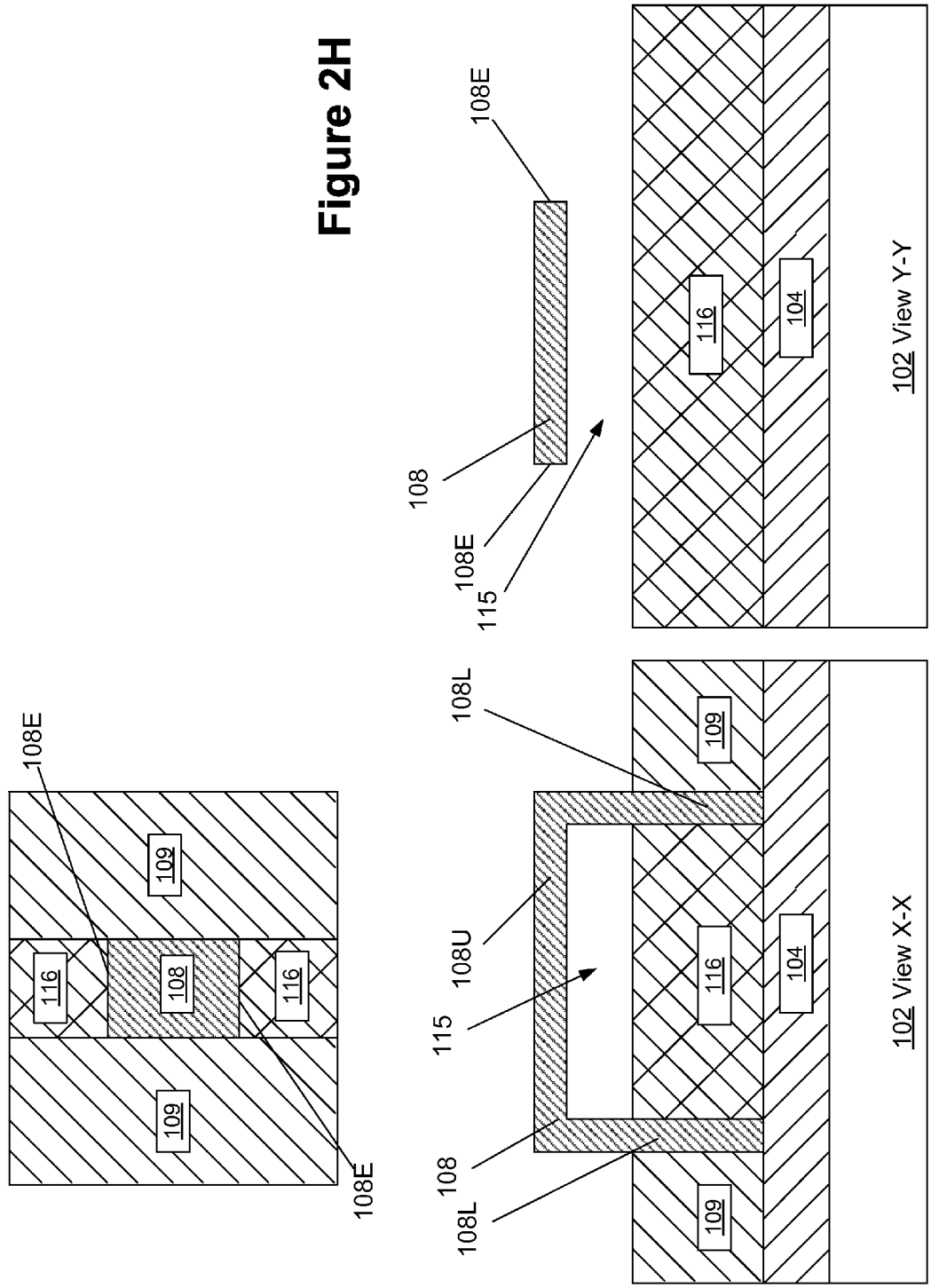

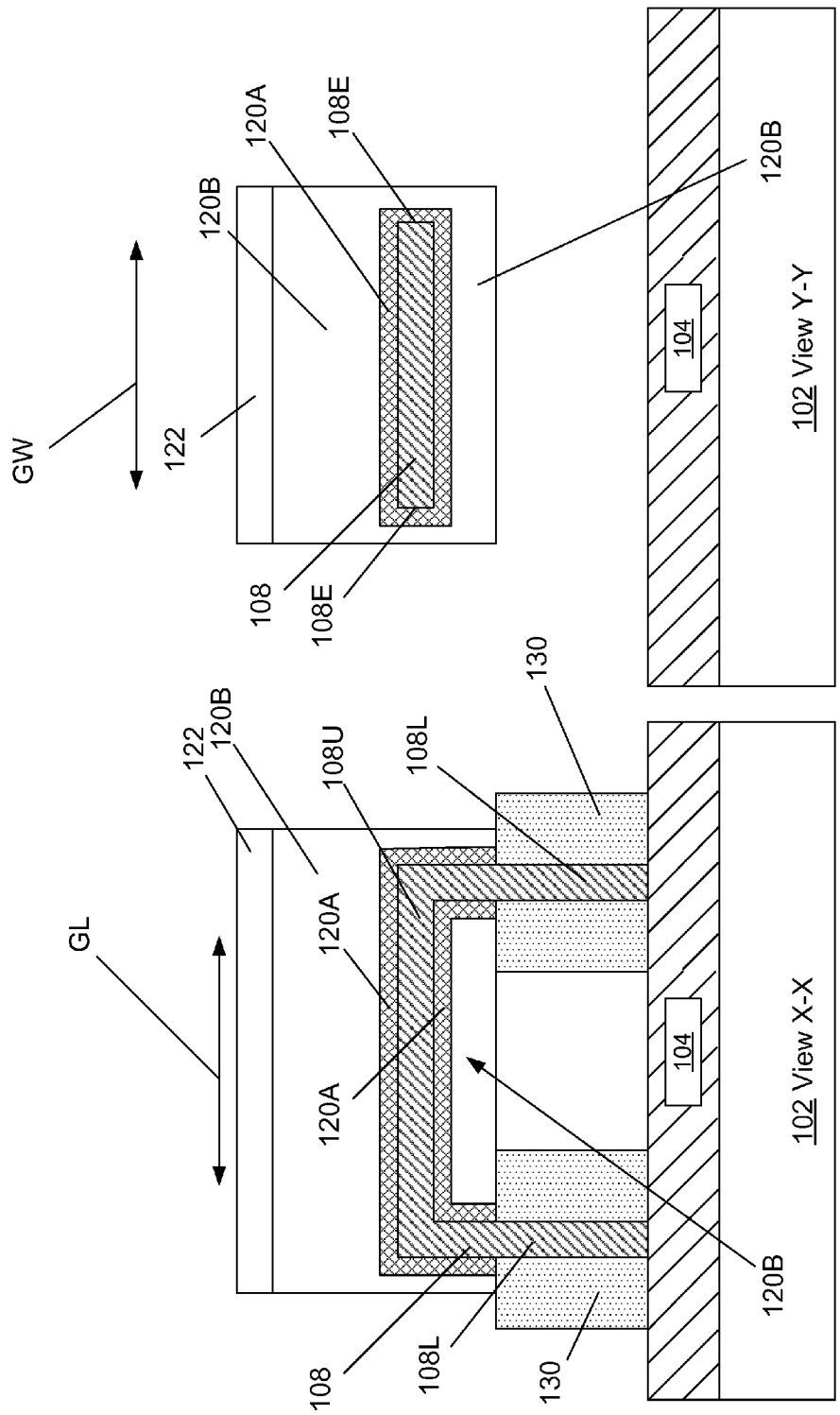

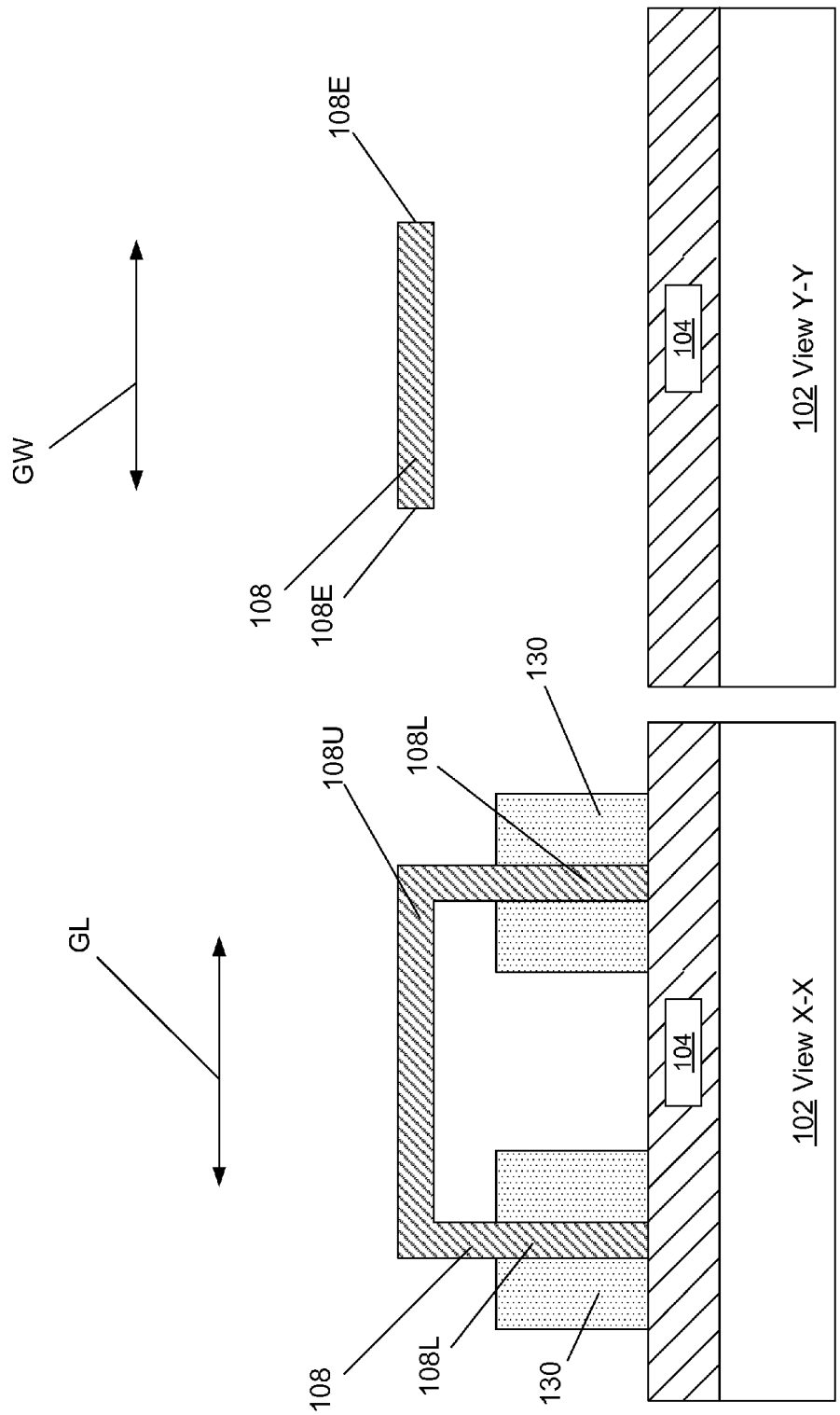

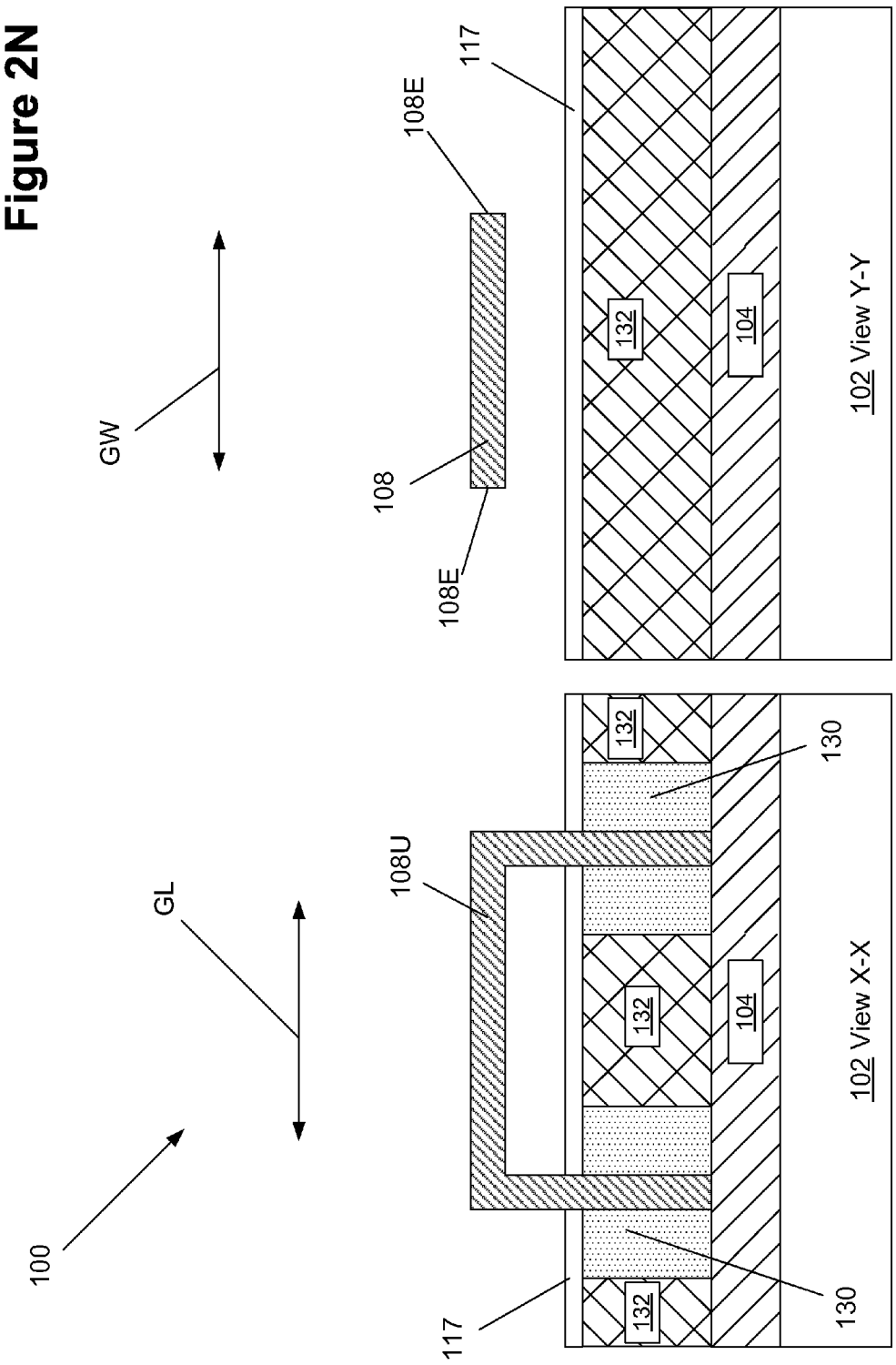

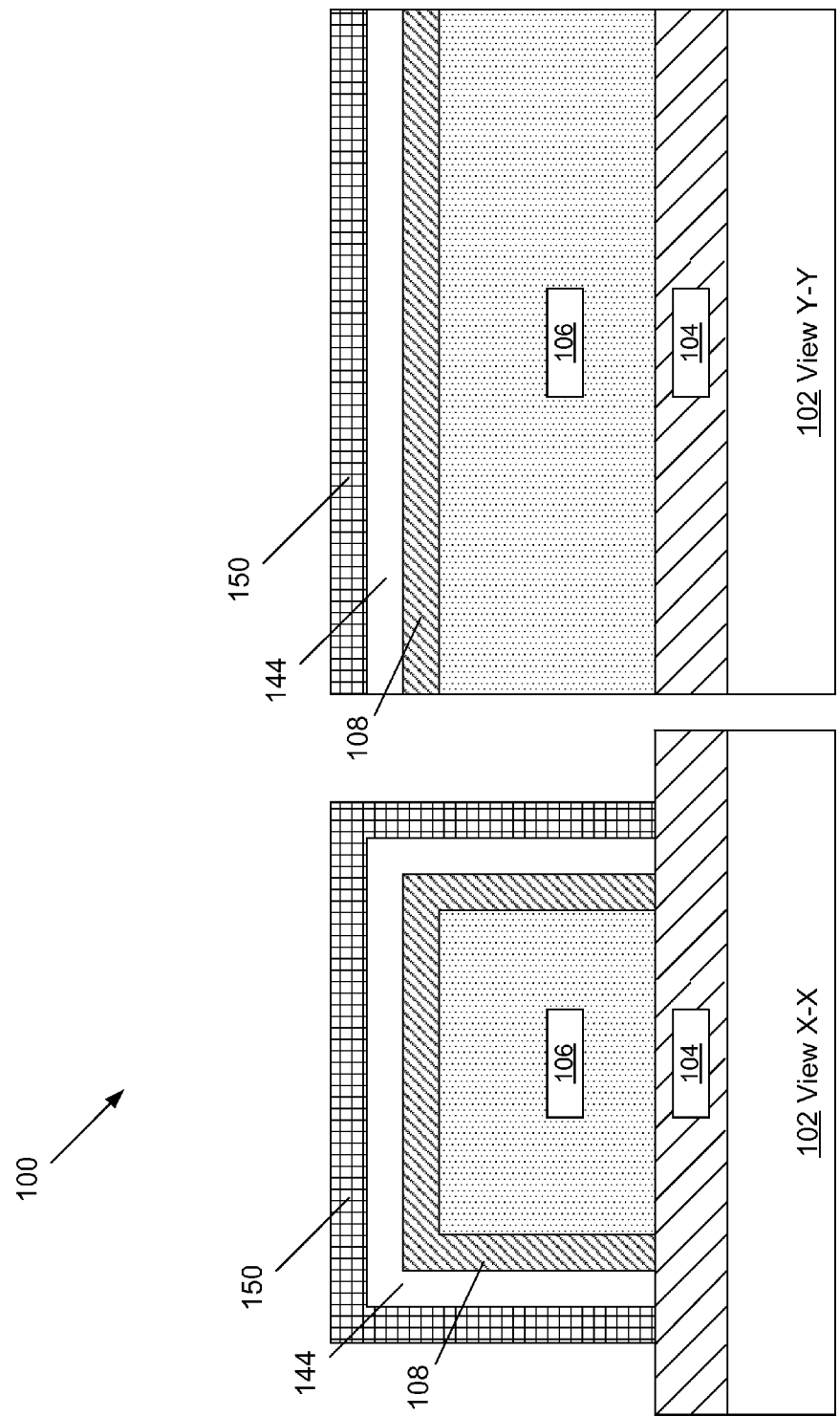

METHODS OF FORMING A NANOWIRE DEVICE WITH A GATE-ALL-AROUND-CHANNEL CONFIGURATION AND THE RESULTING NANOWIRE DEVICE

BACKGROUND OF THE INVENTION

1. Field of the Invention

Generally, the present disclosure relates to the manufacture of FET semiconductor devices, and, more specifically, to various methods of forming a nanowire device with a gate-all-around-channel configuration, and the resulting semiconductor device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region, a channel region that is positioned between the source region and the drain region, and a gate electrode positioned above the channel region. Current flow through the FET is controlled by setting the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region. To improve the operating speed of conventional FETs, device designers have significantly reduced the channel length of such devices, which has resulted in improving the switching speed and in lowering operation currents and voltages of FETs. However, decreasing the channel length of a FET also makes it difficult to control the channel region of the device. This is sometimes referred to as a so-called short channel effect, wherein the characteristic of the FET as an active switch is degraded.

In contrast to a planar FET, there are so-called 3D devices, such as an illustrative FinFET device, which is a three-dimensional structure. FIG. 1 is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes a plurality of trenches 14 that define three illustrative fins 16, a gate structure 18, sidewall spacers 20 and a gate cap layer 22. The fins 16 have a three-dimensional configuration: a height H, a width W and an axial length L. The axial length L of the fins 16 corresponds to the direction of current travel in the device 10 when it is operational. The portions of the fins 16 covered by the gate structure 18 are the channel regions of the FinFET device 10. The gate structure 18 is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode (not separately shown) for the device 10.

Another known transistor device is typically referred to as a nanowire device. In a nanowire device, at least the channel region of the device is comprised of one or more very small diameter, wire-like semiconductor structures. As with the other types of transistor devices discussed above, current flow through a nanowire device is controlled by setting the voltage applied to the gate electrode. When an appropriate voltage is applied to the gate electrode, the channel region of the nanowire device becomes conductive, and electrical current is permitted to flow between the source region and the drain region through the conductive channel region, i.e., current flows through the nanowire structure. Persons skilled in the art will recognize that there are various known techniques that may be employed to manufacture such nanowire devices. Accordingly, the processing details for forming a basic nanowire device structure will not be described in detail herein.

As device dimensions have decreased, it is becoming ever more challenging to maintain adequate control of the channel region of transistor devices during operation. Device designers have used various techniques to insure that there is adequate capacitive coupling between the gate electrode of the device and the channel region of the device during operation. Absent proper capacitive coupling, control of the channel region is difficult and may result in devices having less desirable electrical performance capabilities. In the case of nanowire devices, device designers have such devices wherein the gate electrode and gate insulation layer surround the nanowire structure in an effort to obtain better control of the channel region.

The present disclosure is directed to various methods of forming a nanowire device or a Fin-type device with a gate-all-around-channel configuration, and the resulting semiconductor device, that may reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a nanowire device with a gate-all-around-channel configuration, and the resulting semiconductor device. One illustrative method disclosed herein includes, among other things, forming a fin in a semiconductor substrate, performing at least one first epitaxial deposition process to form at least one layer of epi semiconductor cladding material around an exposed portion of the fin, performing at least one etching process to pattern the at least one layer of cladding material and the fin, thereby resulting in a patterned portion of the fin being positioned under the patterned at least one layer of cladding material, the patterned at least one layer of cladding material have an upper portion and a plurality of substantially vertically oriented legs extending downward from the upper portion, performing at least one etching process to selectively remove the patterned fin relative to the patterned at least one layer of cladding material and thereby form an opening under the patterned at least one layer of cladding material, forming a sacrificial gate structure all around at least a portion of the upper portion of the at least one layer of cladding material, with the sacrificial gate structure in position, performing a second epitaxial deposition process to form an epi semiconductor source/drain region on each of the substantially vertically oriented legs, removing the sacrificial gate structure, and forming a final gate structure all around at least a portion of the upper portion of the at least one layer of cladding material.

Another illustrative method disclosed herein involves, among other things, forming a fin in a semiconductor substrate, performing at least one first epitaxial deposition process to form at least one layer of epi semiconductor cladding material around an exposed portion of the fin, performing at least one etching process to pattern the at least one layer of cladding material and the fin, thereby resulting in a patterned portion of the fin being positioned under the patterned at least one layer of cladding material, the patterned at least one layer of cladding material have an upper portion and a plurality of substantially vertically oriented legs extending downward from the upper portion, performing at least one etching process to selectively remove the patterned fin relative to the patterned at least one layer of cladding material and thereby form an opening under the patterned at least one layer of cladding material, forming a sacrificial gate structure all around the upper portion of the at least one layer of cladding material and a first portion of each of the substantially vertically oriented legs positioned adjacent the upper portion, with the sacrificial gate structure in position, performing a second epitaxial deposition process to form an epi semiconductor source/drain region on a second portion of each of the substantially vertically oriented legs, removing the sacrificial gate structure, forming a layer of insulating material that is positioned on an upper surface of each of the source/drain regions, and forming a final gate structure on the layer of insulating material and all around at least a portion of the upper portion of the at least one layer of cladding material.

One illustrative device disclosed herein includes, among other things, a layer of insulating material, a nanowire comprised of at least one layer of epi semiconductor material positioned above the layer of insulating material, a gate structure positioned all around at least a portion of the nanowire and above the layer of insulating material, and a plurality of epi semiconductor source/drain regions positioned vertically below the layer of insulating material, wherein each of the source/drain regions is vertically spaced apart from the gate structure and wherein the nanowire structure is coupled to the gate structure and each of the source/drain regions.

BRIEF DESCRIPTION OF THE DRAWINGS

The disclosure may be understood by reference to the following description taken in conjunction with the accompanying drawings, in which like reference numerals identify like elements, and in which.

Figure 1:
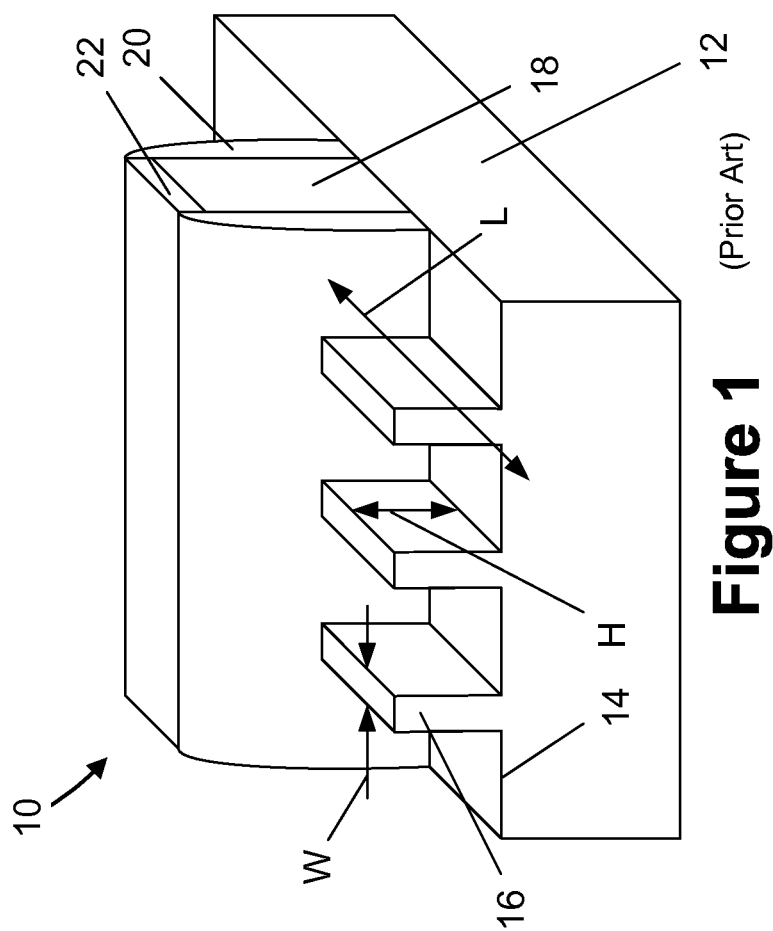
FIG. 1 is a perspective view of one illustrative embodiment of a prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a nanowire device 100 with a gate-all-around-channel configuration, and the resulting semiconductor device. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

In one embodiment, the illustrative device 100 will be formed in and above the semiconductor substrate 102, having an illustrative SOI configuration (a bulk semiconductor layer 102, a buried insulation layer ("BOX") 104 and an active layer comprised of silicon formed above the BOX layer 104. The device 100 may be either an NMOS or a PMOS transistor. Of course, the active layer may be comprised of materials other than silicon, e.g., InP, InAs, GaAs, etc. Thus, the terms "substrate" or "semiconductor substrate" should be understood to cover all semiconducting materials and all forms of such materials. The gate structure of the device 100 may be formed using either so-called "gate-first" or "replacement gate" ("gate-last") techniques. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, epi growth processes, spin-coating techniques, etc. The thicknesses of these various layers of material may also vary depending upon the particular application.

Figure 2A:
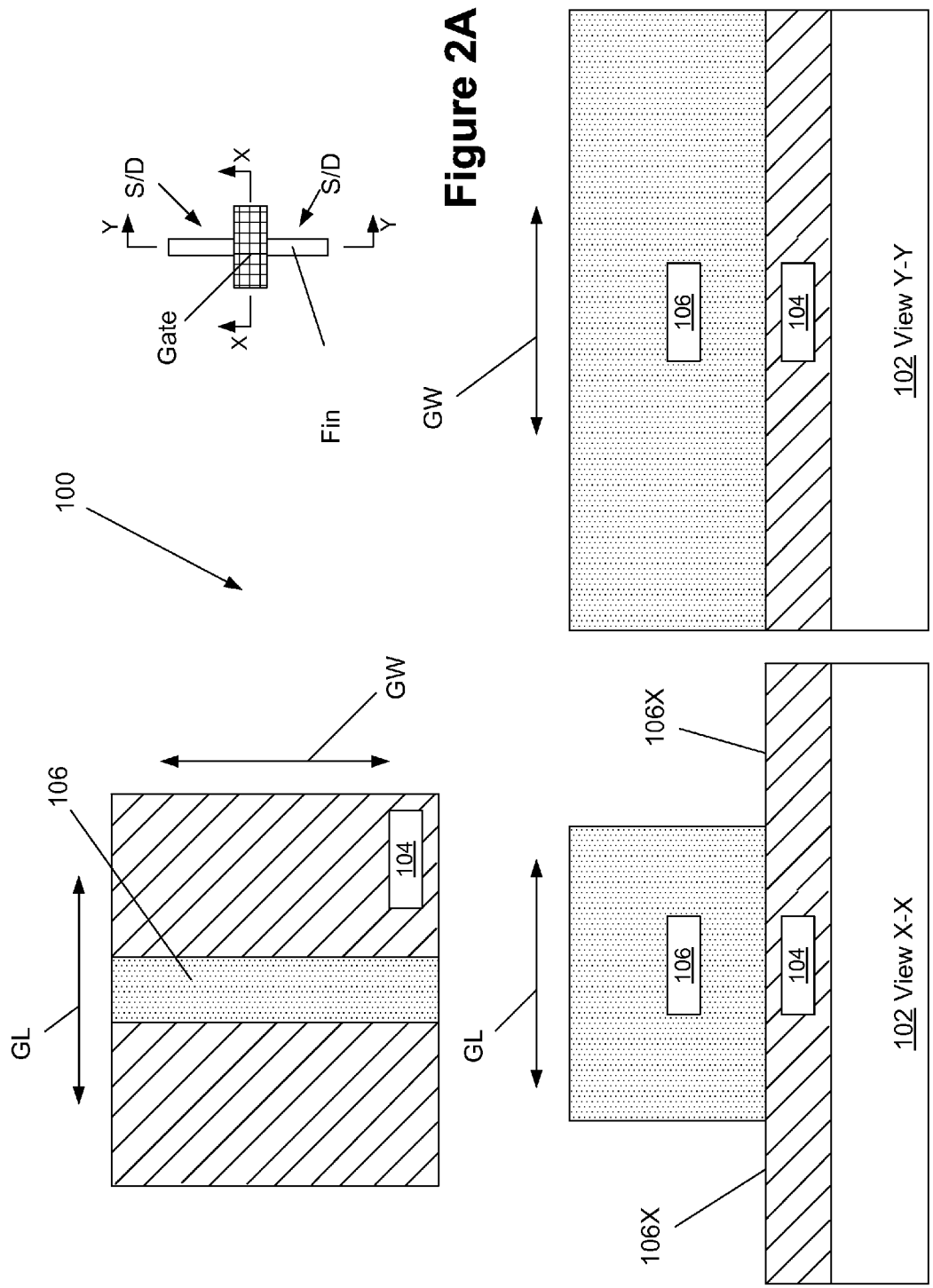
FIGS. 2A-2P depict various illustrative methods disclosed herein of forming a nanowire device with a gate-all-around-channel configuration, and the resulting semiconductor device.

As shown in a simplistic plan drawing shown in the upper right corner of FIG. 2A, the view "X-X" is a cross-sectional view taken through a gate structure in a gate length (GL) direction, i.e., in a current transport direction of the device when it is completed, while the view "Y-Y" is a cross-sectional view taken in what will become the gate width (GW) direction of the completed nanowire device.

FIG. 2A depicts the device 100 after several process operations were performed. First, one or more etching processes, e.g., anisotropic etching processes, were performed through a patterned etch mask (not shown), such as a patterned hard mask layer, to define a plurality of fin-formation trenches 106X in the active layer of the SOI substrate. The formation of the trenches 106X results in the formation of a plurality of initial semiconductor fin structures 106. The overall size, shape and configuration of the fin-formation trenches 106X and fins 106 may vary depending on the particular application. In the illustrative examples depicted in the attached drawings, the fin-formation trenches 106X and the fins 106 are all depicted as having a uniform size and shape. However, such uniformity in the size and shape of the fin-formation trenches 106X and the fins 106 is not required to practice at least some aspects of the inventions disclosed herein. In the attached figures, the fin-formation trenches 106X are depicted as having been formed by performing an anisotropic etching process that results in the fin-formation trenches 106X having a schematically depicted, generally rectangular configuration. In an actual real-world device, the sidewalls of the fin-formation trenches 106X may be somewhat inwardly tapered, although that configuration is not depicted in the attached drawings. In some cases, the fin-formation trenches 106X may have a reentrant profile (not shown) near the bottom of the fin-formation trenches 106X. To the extent the fin-formation trenches 106X are formed by performing a wet etching process, the fin-formation trenches 106X may tend to have a more rounded configuration or non-linear configuration as compared to the generally rectangular configuration of the fin-formation trenches 106X that are formed by performing an anisotropic etching process. Thus, the size and configuration of the fin-formation trenches 106X, and the manner in which they are made, as well as the general configuration of the fins 106, should not be considered a limitation of the present invention. For ease of disclosure, only the substantially rectangular fin-formation trenches 106X and fins 106 will be depicted in the subsequent drawings. Moreover, the device 100 may be formed with any desired number of fins 106. The width and height of the fin structures 106 as well as the depth of the trenches 106X may vary depending upon the particular application.

Figure 2B:
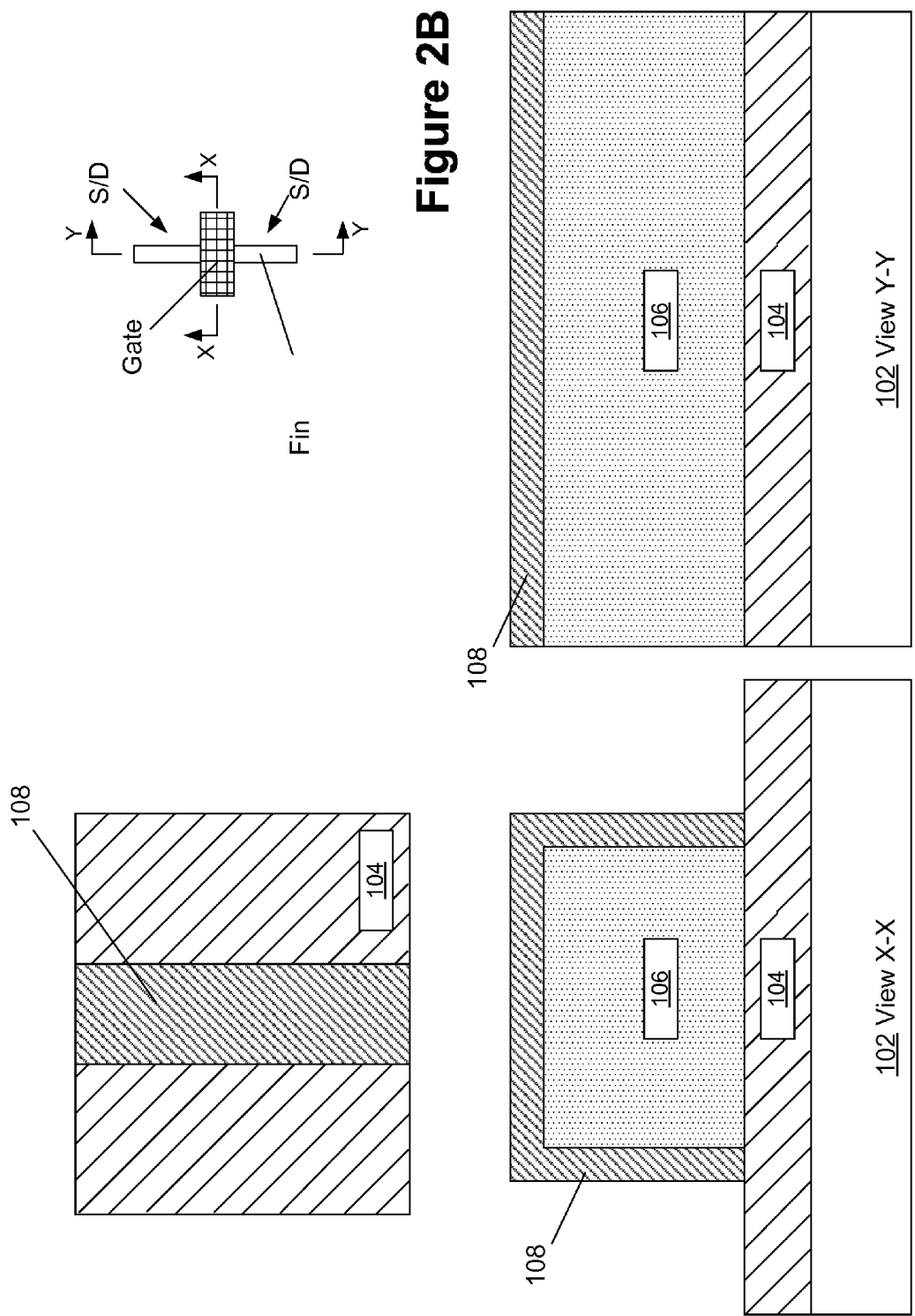

FIG. 2B depicts the device 100 after a layer of semiconductor cladding material 108 was formed around the fins 106 by performing any of a variety of known epitaxial deposition processes. The thickness and material of construction of the cladding layer 108 may vary depending upon the particular application. For example, in one embodiment, the layer 108 may be comprised of a layer of silicon-germanium ($Si_{(1-x)}Ge_{(x)}$) or silicon, and it may have a thickness of about 2-4 nm. In one example, the layer 108 may be a layer of silicon-germanium ($Si_{(1-x)}Ge_{(x)}$), where the value of x falls within the range of about 0.10-0.80 (e.g., $SiGe_{(0.1)}$-$SiGe_{(0.8)}$). In one illustrative embodiment, the layer 108 may be made of materials that are specifically tailored for N-type or P-type devices. If desired, various materials, such as carbon, may be incorporated into the layer 108 as it is being formed. In one illustrative embodiment, the cladding layer 108 may be one of a III-V material, InGaAs, GaAs, InAs, GaSb, InSbAs, SiGe, etc.

Figure 2C:
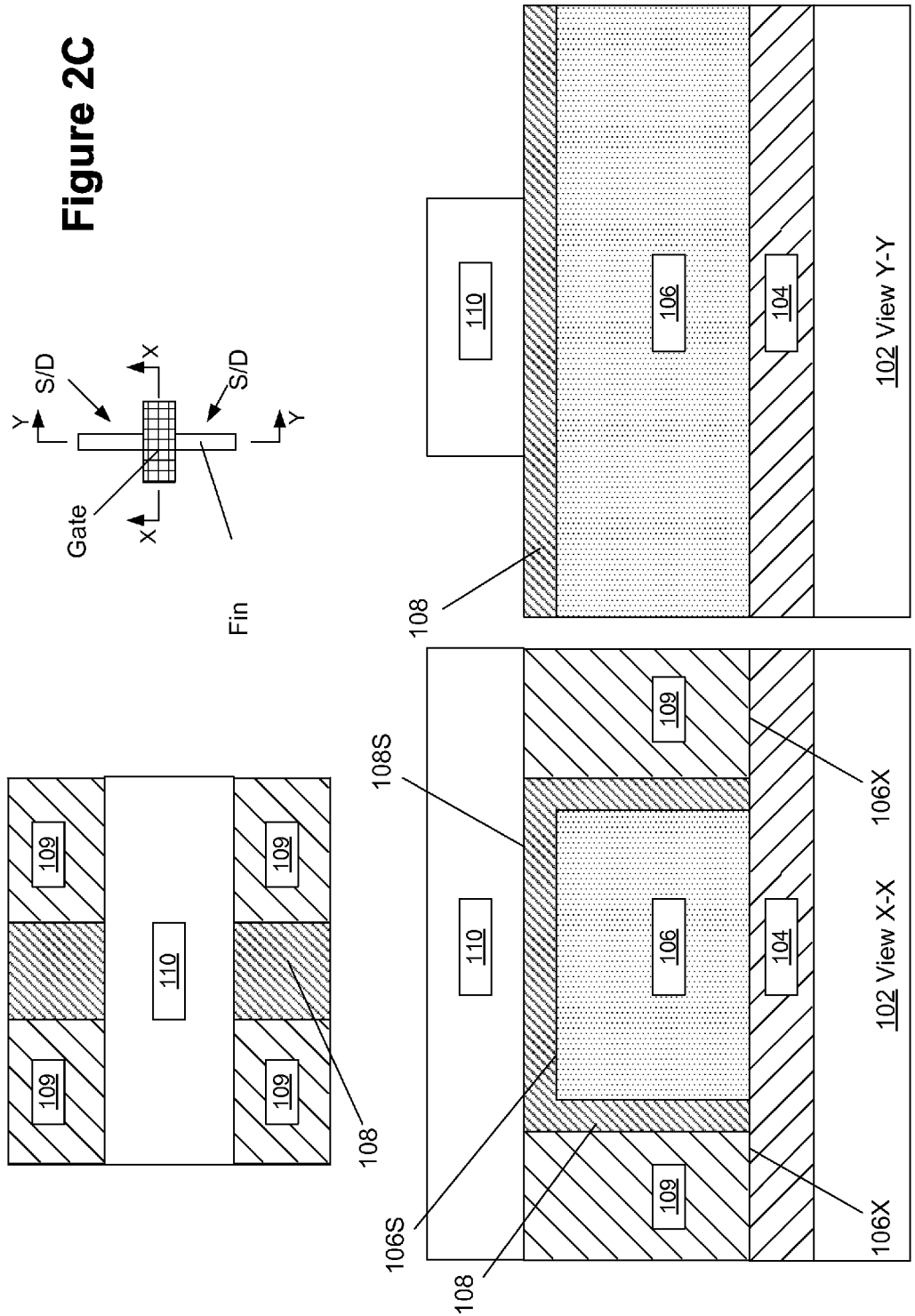

FIG. 2C depicts the device 100 after several process operations were performed. First, a layer of insulating material 109 was formed on the device 100 so as to overfill the trenches 106X between the fins 106/cladding layer 108. The layer of insulating material 109 may be comprised of a variety of different materials, such as, for example, silicon dioxide, silicon nitride, silicon oxynitride or any other dielectric material in common use in the semiconductor manufacturing industry, etc., or multiple layers thereof, etc., and it may be formed by performing a variety of techniques, e.g., CVD, ALD, etc. The layer of insulating material 109 may be comprised of the same material as that of the BOX layer 104, or it may be comprised of a different material. Next, one or more chemical mechanical polishing (CMP) processes was performed to planarize the upper surface of the layer of insulating material 109 using the upper surface 108S of the cladding layer 108 as a polish-stop layer. After such a CMP process, the portions of the cladding layer 108 positioned above the upper surface 106S of the fins 106 are exposed for further processing. With continuing reference to FIG. 2C, a patterned masking layer 110, such as a patterned layer of photoresist material, was formed above the device 100 using traditional photolithography tools and techniques.

Figure 2D:
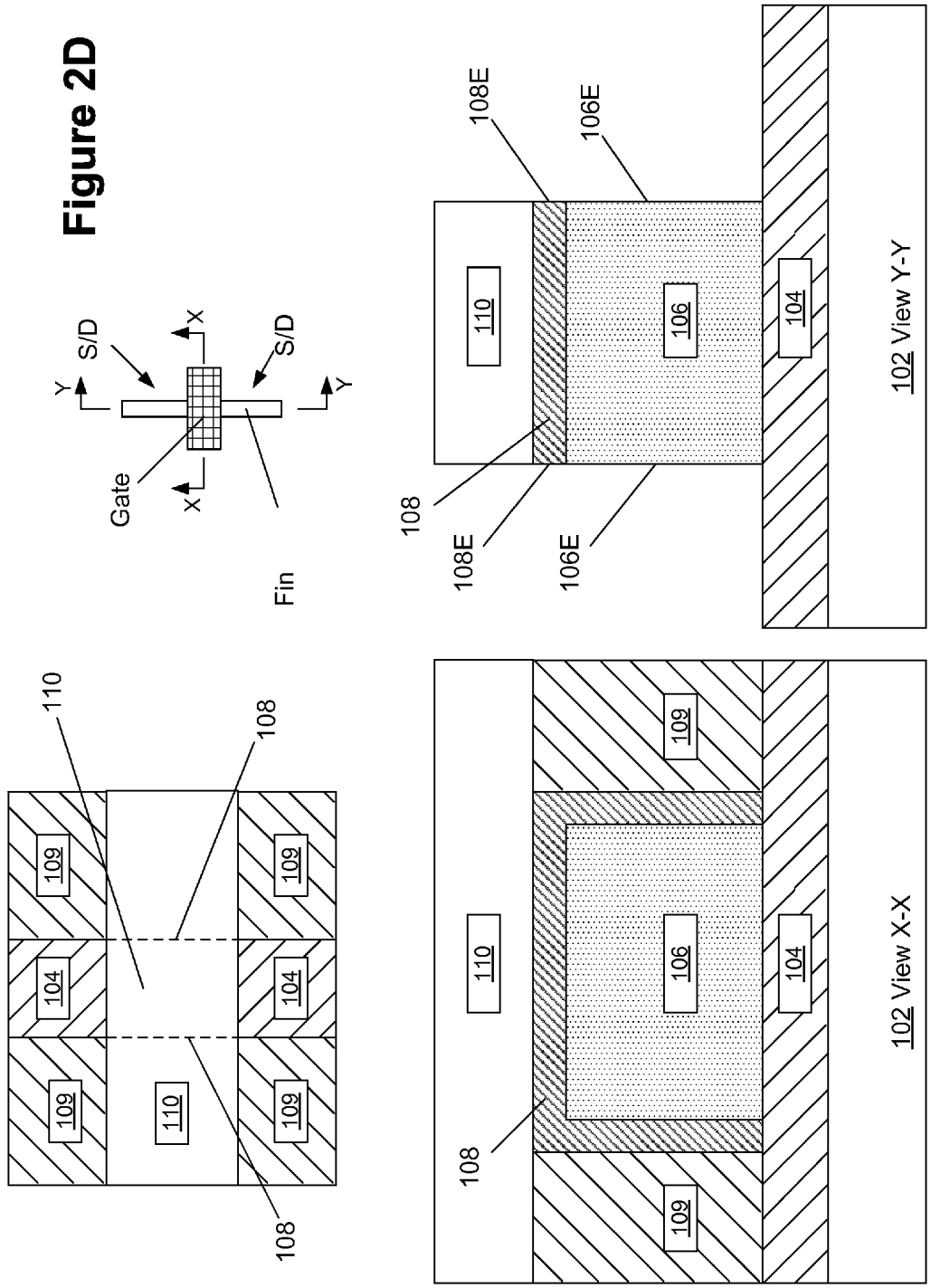

Next, as shown in FIG. 2D, one or more etching processes, such as a wet or dry etching process, was performed through the patterned mask layer 110 to selectively remove the exposed portions of the cladding layer 108 and the initial fin 106 relative to the surrounding structures and layers. These etching processes results in a patterned layer of cladding material 108 having etched edges 108E (see view Y-Y) and a patterned portion of the fin 106 having etched edges 106E (see view Y-Y) being positioned under the patterned layer of cladding material 108.

Figure 2E:
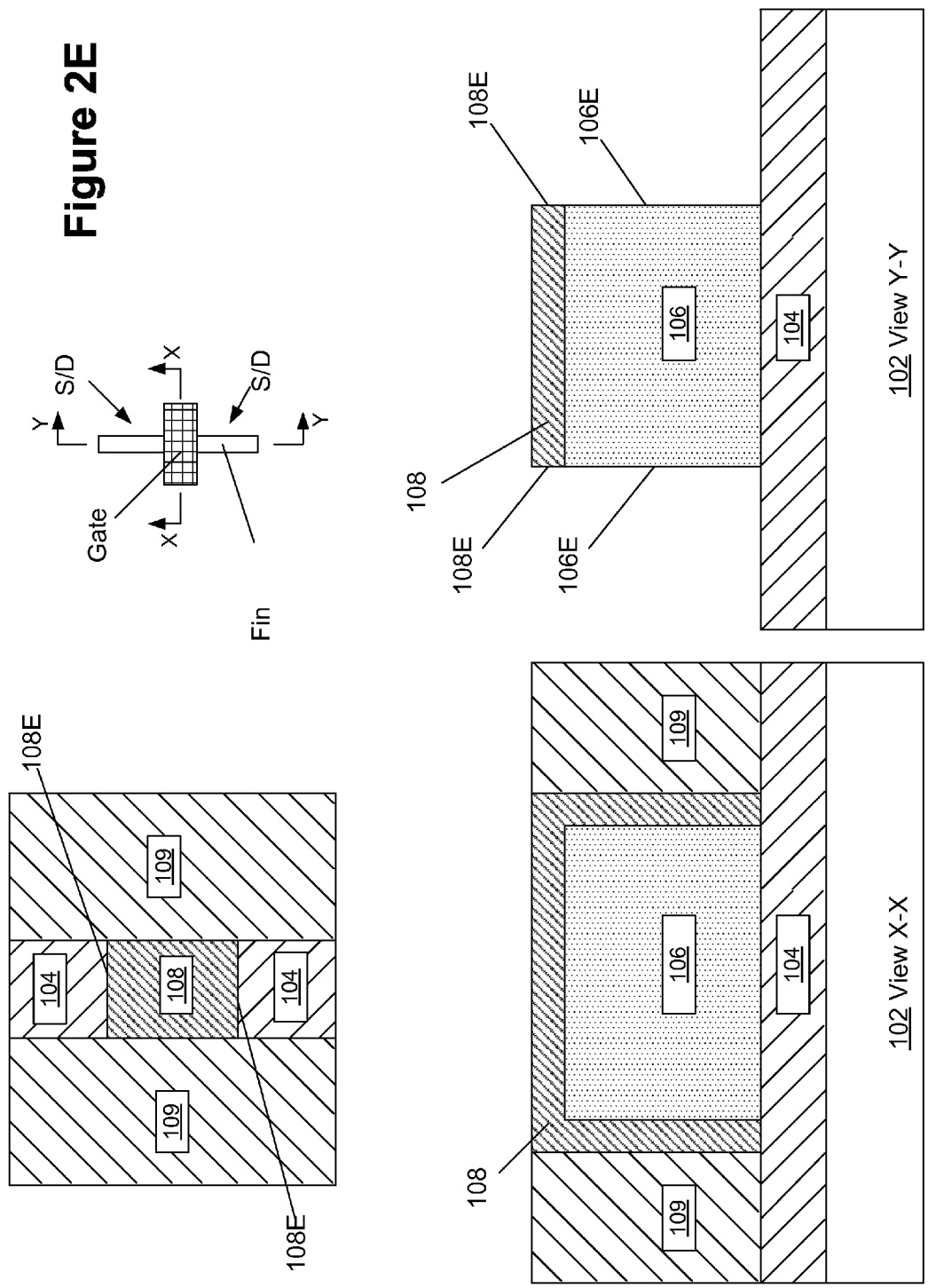

FIG. 2E depicts the device 100 after the above-described patterned mask layer 110 was removed. The patterned mask layer 110 may be removed by performing a number of known process operations depending upon the composition of the patterned mask layer 110, e.g., by performing an ashing process where the mask layer 110 is comprised of a photoresist material.

FIG. 2F depicts the device after a selective etching process was performed to remove exposed patterned fin portion 106 relative to the surrounding structures, i.e., the patterned cladding layer 108 and the layer of insulating material 109 and the BOX layer 104. This etching process results in the formation of an opening 114 under the patterned cladding layer 108. The view Z-Z has been added to FIG. 2F in an effort to provide further explanation of the structure of the device at this point in the process flow. The view Z-Z is taken where indicated in the plan view shown in FIG. 2F. As depicted, the patterned cladding layer 108 is generally comprised of an upper portion 108U and a plurality of substantially vertically oriented legs 108L.

FIG. 2G depicts the device 100 after several process operations were performed to essentially re-fill the opening 114 with insulating material 116. In one embodiment, the layer of insulating material 116 may be deposited above the surface of the device so as to overfill the opening 114. Thereafter, a CMP process may be performed to remove excess portions of the layer of insulating material 116 using the patterned cladding layer 108 as a polish-stop layer. At this point in the process flow, the upper surface of the upper portion 108U of the patterned cladding layer 108 is exposed. The layer of insulating material 116 may be comprised of a variety of different materials, such as, for example, silicon dioxide, silicon nitride, silicon oxynitride or any other dielectric material in common use in the semiconductor manufacturing industry, etc., or multiple layers thereof, etc., and it may be formed by performing a variety of techniques, e.g., CVD, ALD, etc. The layer of insulating material 116 may be comprised of the same material as that of the layer of insulating material 109, or it may be comprised of a different material.

FIG. 2H depicts the device 100 after one or more recess etching processes were performed to selectively remove portions of the layers of insulating materials 109, 116 relative to the surrounding structures. This process operation results in the formation of an opening 115, the size of which may vary depending upon the particular application. At this point in the process flow, the upper portion 108U of the patterned cladding layer 108 as well as portions of the vertically oriented legs 108L are exposed.

Figure 2I:
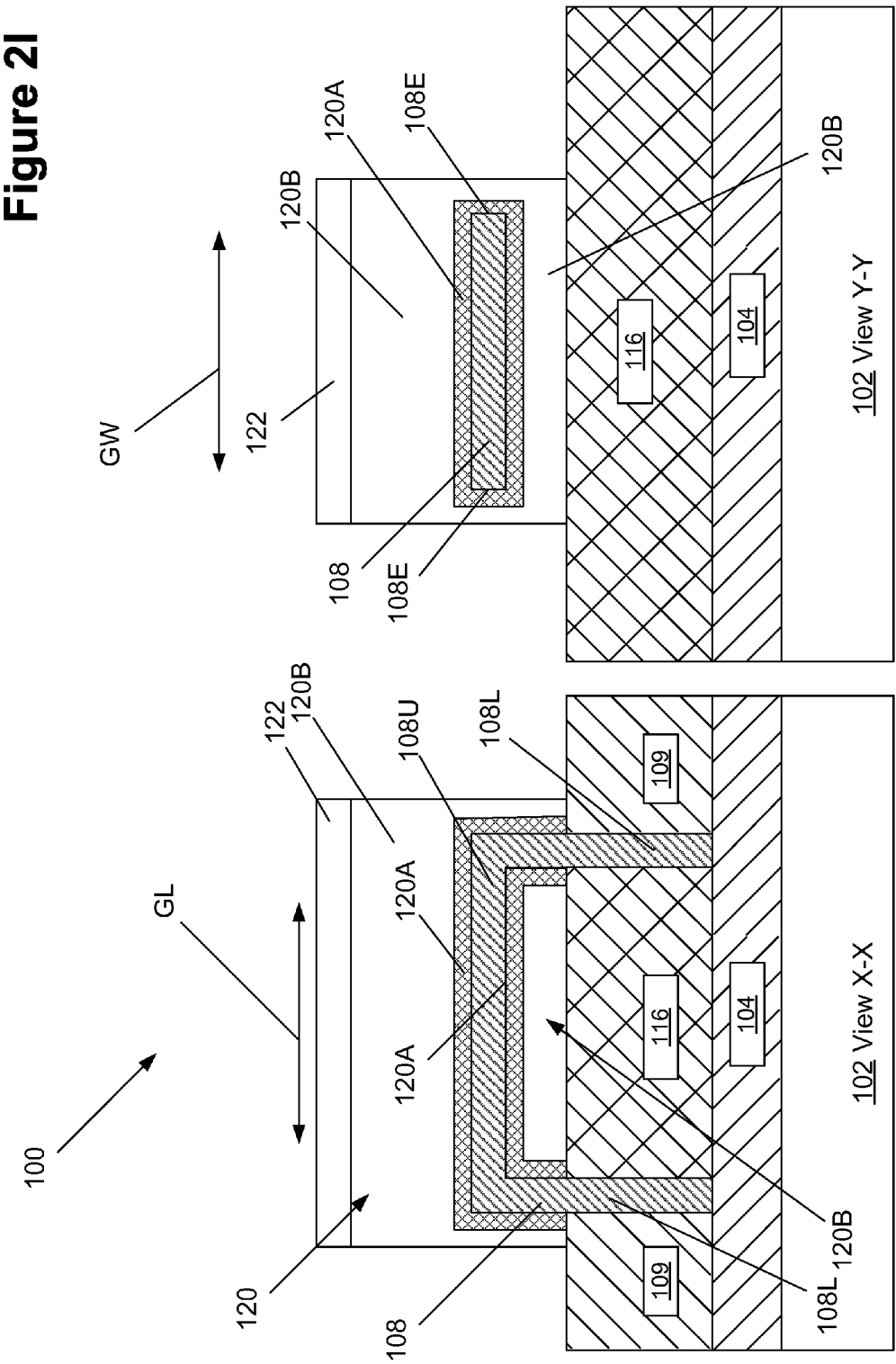

Next, as shown in FIG. 2I, an illustrative dummy or sacrificial gate structure 120 was formed on the device 100 using well-known techniques. The gate-length (GL) and gate-width (GW) direction of the nanowire device 100 are depicted in the drawing. In one illustrative embodiment, the schematically depicted sacrificial gate structure 120 includes an illustrative sacrificial gate insulation layer 120A and an illustrative sacrificial gate electrode 120B. An illustrative gate cap layer 122 (e.g., silicon nitride) may also be formed above the sacrificial gate electrode 120B. Sidewall spacers that are typically formed adjacent such a sacrificial gate structure are not required to practice the present invention, although they may be formed if desired. The sacrificial gate structure 120 and the gate cap layer 122 may all be formed using traditional manufacturing techniques. The sacrificial gate insulation layer 120A may be comprised of a variety of different materials, such as, for example, silicon dioxide, etc. The thickness of the sacrificial gate insulation layer 120A may also vary depending upon the particular application, e.g., it may have a physical thickness of about 0.5-3 nm. Similarly, the sacrificial gate electrode 120B may also be made of a variety of conductive materials, e.g., silicon nitride. Importantly, as discussed more fully below, the materials of construction for the sacrificial gate insulation layer 120A and the sacrificial gate electrode 120B should be materials where epi semiconductor material cannot be formed by performing an epi growth process. As depicted, the sacrificial gate structure 120 wraps around the upper portion 108U of the cladding material 108 as well as portions of the legs 108L of the cladding material. In operation, at least the portions of the cladding layer surrounded by the sacrificial gate structure 120 will act as the channel region of the device 100.

Figure 2J:
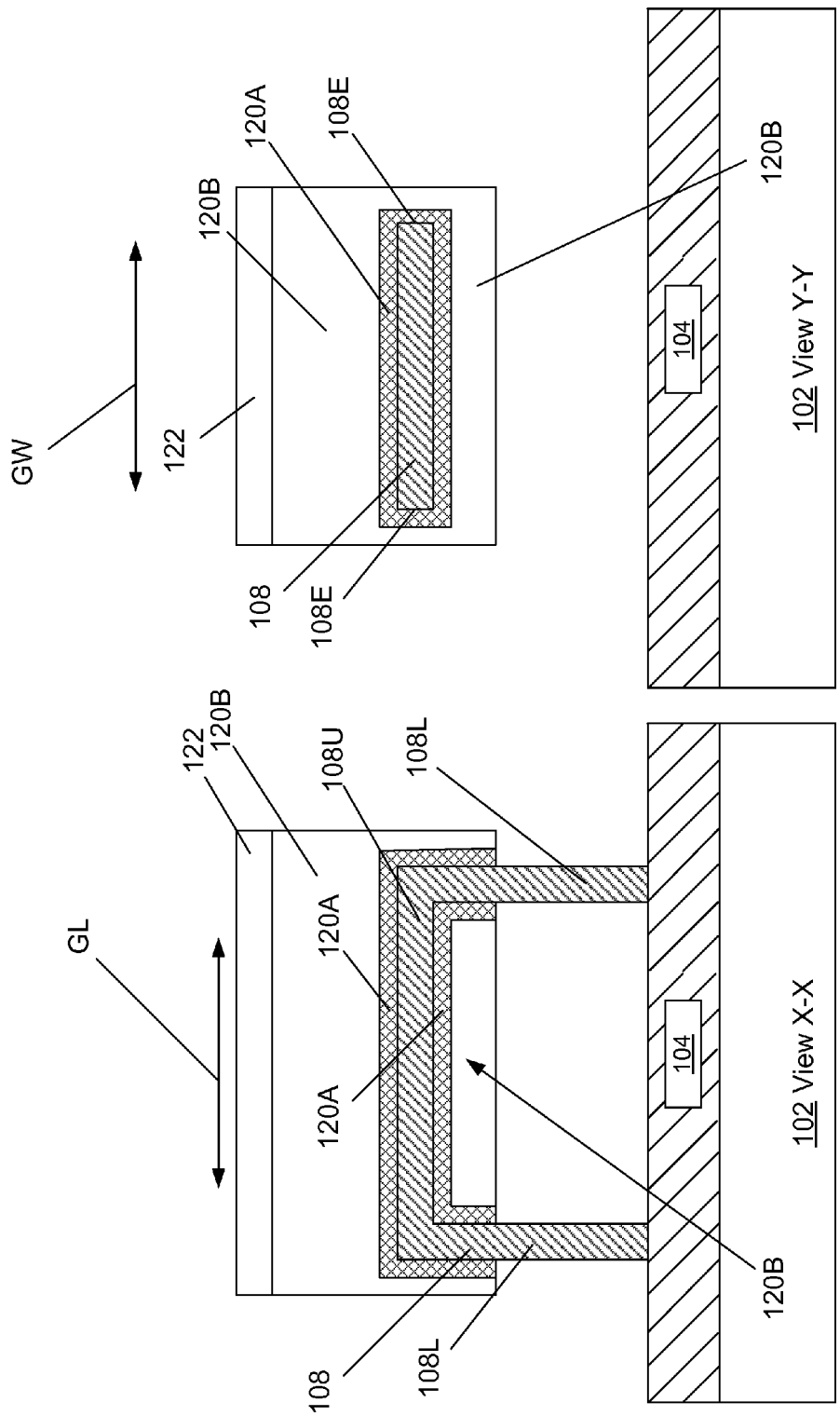

FIG. 2J depicts the device 100 after one or more recess etching processes were performed to remove at least portions of the layers of insulating material 109, 116, and in some applications, all of the material layers 109, 116 relative to the surrounding structures. This process operation results in the exposure of portion of the legs 108L of the cladding material below the sacrificial gate structure 120. The amount (i.e., thickness) of the layers 109, 116 removed may depend on the size or thickness of the source/drain regions that are to be formed on the device 100.

FIG. 2K depicts the device 100 after an epitaxial growth process was performed to form source/drain regions 130 on the exposed portions of the legs 108L of the cladding material 108 below the sacrificial gate structure 120. As noted above, the materials of construction for the sacrificial gate structure 120 are selected such that the epi material for the source/drain regions does not grow on the sacrificial gate structure 120. The source/drain regions 130 may be comprised of a variety of different semiconductor materials, depending upon the composition of the cladding layer 108. For example, the source/drain regions may be comprised of silicon, SiGe, a III-V material, InGaAs, GaAs, InAs, GaSb, InSbAs, etc. The physical size of the source/drain regions 130 may vary depending upon the particular application.

FIG. 2L depicts the device 100 after one or more etching processes were performed to remove the sacrificial gate structure 120 and the gate cap layer 122 relative to the surrounding structures.

Figure 2M:
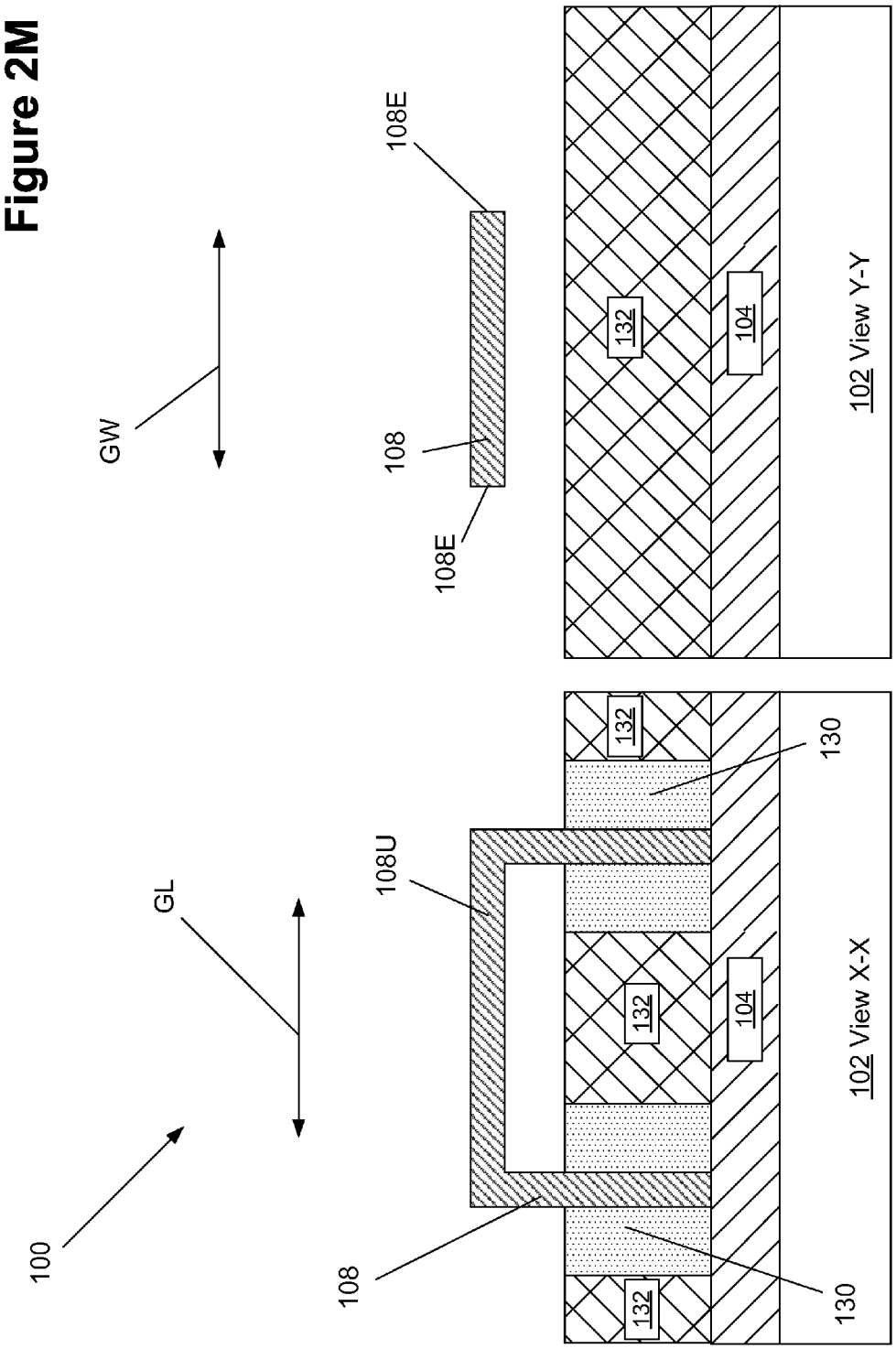

FIG. 2M depicts the device 100 after a layer of insulating material 132 was deposited on the device 100, after a CMP process was performed to planarize the upper surface of the layer of insulating material 132 and after a recess etching process was performed to recess the layer of insulating material 132 to the desired height level, i.e., approximately level with the upper surface of the source/drain regions 130. As depicted, the recessed layer of insulating material 132 fills the area between the source/drain regions 130. The layer of insulating material 132 may be comprised of a variety of different materials, such as, for example, silicon dioxide, silicon nitride, silicon oxynitride or any other dielectric material in common use in the semiconductor manufacturing industry, etc., or multiple layers thereof, etc., and it may be formed by performing a variety of techniques, e.g., CVD, ALD, etc.

FIG. 2N depicts the device 100 after a layer of insulating material 117 was deposited on the recessed layer of insulating material 132 and the source/drain regions 130, after a CMP process was performed to planarize the upper surface of the layer of insulating material 117, and after a recess etching process was performed to recess the layer of insulating material 117 to the desired thickness, e.g., about 5-10 nm. As will be appreciated by those skilled in the art after a complete reading of the present application, the layer of insulating material 117 will effectively serve as an insulating spacer material positioned between the source/drain regions 130 and the final gate structure for the device 100, which is yet to be formed. The layer of insulating material 132 may be comprised of a variety of different materials, such as, for example, silicon dioxide, silicon nitride, silicon oxynitride or any other dielectric material in common use in the semiconductor manufacturing industry, etc., or multiple layers thereof, etc., and it may be formed by performing a variety of techniques, e.g., CVD, ALD, etc.

Figure 2O:
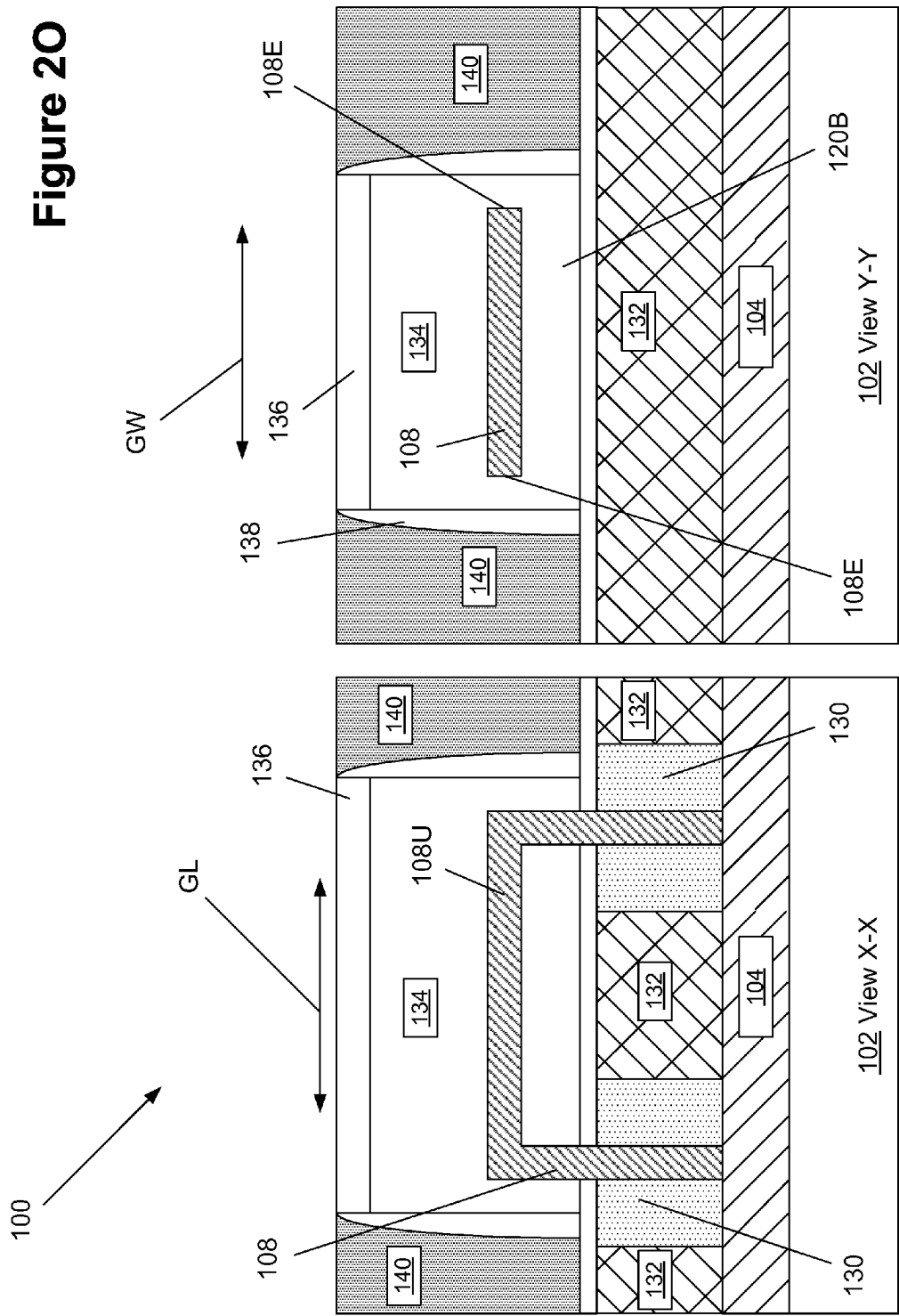

Next, as shown in FIG. 2O, an illustrative final gate structure 134 is formed on the device 100. The gate-length (GL) and gate-width (GW) direction of the nanowire device 100 are depicted in the drawing. In one illustrative embodiment, the schematically depicted final gate structure 134 includes an illustrative gate insulation layer (not separately shown) and an illustrative gate electrode (not separately shown). An illustrative gate cap layer 136 (e.g., silicon nitride) may also be formed above the final gate structure 134. Also depicted are illustrative sidewall spacers 138 (e.g., silicon nitride) that may be formed adjacent the final gate structure 134, although such spacers 138 may not be required in all applications. Also depicted is a layer of insulating material 140, e.g., silicon dioxide. The final gate structure 134, the gate cap layer 136 and the sidewall spacer 138 (if used) may all be formed using traditional manufacturing techniques. The gate insulation layer may be comprised of a variety of different materials, such as, for example, silicon dioxide, a so-called high-k (k value greater than 10) insulation material (where k is the relative dielectric constant), etc. The thickness of the gate insulation layer may also vary depending upon the particular application, e.g., it may have a physical thickness of about 0.5-3 nm. Similarly, the gate electrode may also be of a variety of conductive materials, such as highly doped polysilicon or amorphous silicon, or it may be comprised of one metal layers or a stack of metal layers that act as the gate electrode. The gate electrode may also be comprised of one metal layer to match the required work function of the device and a metal layer cap to prevent oxidation and provide good contact adhesion and low contact resistance. As will be recognized by those skilled in the art after a complete reading of the present application, the final gate structure, i.e., the gate insulation layer and the gate electrode, is intended to be representative in nature. That is, the final gate structure 134 may be comprised of a variety of different materials and it may have a variety of configurations. As depicted, the final gate structure 134 wraps around the upper portion 108U of the cladding material 108 as well as portions of the legs 108L of the cladding material 108. In operation, at least the portions of the cladding layer surrounded by the final gate structure 134 will act as the channel region of the device 100.

In one embodiment, the materials for the final gate structure 134 may be deposited on and around the exposed cladding material 108, followed by the deposition of the material for the gate cap layer 136. Thereafter, these layers of material may be patterned to define the basic final gate structure 134 with the gate cap layer 136 positioned on the top of the final gate structure 134. If desired, the sidewall spacers 138 may then be formed adjacent the final gate structure 134 using traditional techniques. However, since the epi source/drain regions 130 have already been formed, the spacers 138 may not be needed or, if employed, they may be formed from any desirable material, e.g., a low-k material to reduce the capacitance between the source/drain contacts and the final gate structure 134. Thereafter, the layer of insulating material 140 may be deposited and planarized using the gate cap layer 136 as a polish-stop layer.

In another process flow, the layer of insulating material 140 may be initially deposited above the layer of insulating material 117 and the exposed portions of the cladding material 108. The layer of insulating material 140 may then be patterned to define a gate cavity (not shown) above the exposed portions of the cladding material, wherein the layer of insulating material 117 serves as the "floor" of the gate cavity. The exposed portions of the cladding material 108 are exposed within the gate cavity. Traditional photolithography and etching techniques may be employed to form the gate cavity in the layer of insulating material 140. Thereafter, the materials for the final gate structure 134 may be sequentially deposited in the gate cavity in the layer of insulating material 140 using techniques that are similar to those employed in traditional replacement gate manufacturing materials. Ultimately, one or more CMP processes will be performed to remove the materials of the final gate structure 134 positioned outside of the gate cavity and above the layer of insulating material 140. At that point, the materials of the final gate structure 134 may be recessed within the gate cavity to make room for the gate cap layer 136. The gate cap layer 136 may be formed by overfilling the remaining portions of the gate cavity above the recessed gate material and thereafter performing a CMP process using the layer of insulating material 140 as a polish-stop layer to thereby remove excess amounts of the gate cap material.

At the point of fabrication depicted in FIG. 2O, traditional manufacturing techniques may be performed to complete the manufacture of the device 100. For example, contacts and metallization layers may be formed above the device 100 using traditional techniques.

FIG. 2P depicts an embodiment wherein, instead of the single layer of cladding 108 depicted in FIG. 2B, three layers of cladding material may be formed on the fin 106. Other than that, the processing of the device and the resulting structure will be the same. Accordingly, FIG. 2P depicts the device 100 at a point in fabrication that corresponds to that depicted in FIG. 2B except that three layers of semiconductor cladding material 108, 144 and 150 were sequentially formed around the fin 106 by performing known epitaxial deposition processes. The thickness and materials of construction of the cladding layers 108, 144 and 150 may vary depending upon the particular application. The cladding layers 108, 144 and 150 need not all be made the same thickness, although such a situation may occur. For example, in one embodiment, all of the cladding layers 108, 144 and 150 may have the same thickness of about 2-4 nm. In general, as will be described more fully below, the cladding layers 108, 144 and 150 should be made of a material such that the material of the fin 106, i.e., the substrate, may be selectively removed (by etching) relative to the cladding layers. In one illustrative embodiment, the layers 108 and 150 may be made of the same semiconductor material, and these layers may be made of materials that are specifically tailored for N-type or P-type devices. In another embodiment, the three cladding layers 108, 144 and 150 may all be made of the same semiconductor material, e.g., silicon germanium, with different concentrations of germanium. For example, the layer 144 (the middle layer or core) may have a lower germanium concentration than that of the silicon germanium material used for the layers 108 and 150. As one particular example, for a PMOS device, the layer 144 may be made of SiGe, where the typical germanium concentration would vary between 10 and 35%, while the layers 108 and 150 may be made of SiGe, where the typical germanium concentration would vary between 40 and 75%. For an NMOS device, the layers 108, 144 and 150 may be similar with lower germanium concentration or based on III-V compound semiconductor materials like InAs, InGaAs, and InGaSb etc. If desired, various materials, such as carbon for group IV semiconductors, may be incorporated into the cladding layers 108, 144 and 150 as they are being formed. In one illustrative embodiment, the cladding layers 108, 144 and 150 may be a III-V material, InGaAs, GaAs, InAs, GaSb, InSbAs, SiGe, etc. As will be appreciated by those skilled in the art after a complete reading of the present application, in the final device, the vast majority of the current will flow in the outer semiconductor layers 108, 150 while the cladding layer 144 will serve as the core or barrier between the two layers 108, 150. That is, in this embodiment, the layers 108 and 150 will define the primary channel regions (also called surface channel) of the device, where substantially all of the current will flow during operation of the device 100, while the layer 144 will act as a core region wherein little if any of the current will flow when the device 100 is in operation.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
forming a fin in a semiconductor substrate;
performing at least one first epitaxial deposition process to form at least one layer of epi semiconductor cladding material around an exposed portion of said fin;
performing at least one etching process to pattern said at least one layer of cladding material and said fin, thereby resulting in a patterned portion of said fin being positioned under the patterned said at least one layer of cladding material, said patterned at least one layer of cladding material having an upper portion and a plurality of substantially vertically oriented legs extending downward from said upper portion;
performing at least one etching process to selectively remove said patterned fin relative to said patterned at least one layer of cladding material and thereby form an opening under said patterned at least one layer of cladding material;
forming a sacrificial gate structure all around at least a portion of said upper portion of said at least one layer of cladding material;
with said sacrificial gate structure in position, performing a second epitaxial deposition process to form an epi semiconductor source/drain region on each of said substantially vertically oriented legs;
removing said sacrificial gate structure; and
forming a final gate structure all around at least a portion of said upper portion of said at least one layer of cladding material.

2. The method of claim 1, wherein said fin is comprised of silicon and said cladding material is comprised of one of SiGe, a III-V material, InGaAs, GaAs, InAs, GaSb, or InSbAs.

3. The method of claim 1, wherein said final gate structure is comprised of a silicon dioxide gate insulation layer and a polysilicon gate electrode.

4. The method of claim 1, wherein said final gate structure is comprised of a high-k gate insulation layer and a gate electrode comprised of at least one layer of metal.

5. The method of claim 1, wherein said substrate is a silicon substrate.

6. The method of claim 1, wherein, prior to forming said final gate structure, the method further comprises:
forming a layer of insulating material so as to overfill the opening under said patterned cladding material; and
performing a recess etching process on at least said layer of insulating material to remove portions of said layer of insulating material and thereby expose at least said upper portion of said patterned cladding material.

7. The method of claim 1, wherein, prior to forming said final gate structure, the method further comprises forming a layer of insulating material that is positioned on an upper surface of each of said source/drain regions and wherein forming said final gate structure comprises forming said final gate structure on said layer of insulating material positioned on said upper surfaces of said source/drain regions.

8. The method of claim 1, wherein said at least one layer of cladding material is comprised of a single layer of cladding material.

9. The method of claim 1, wherein said at least one layer of cladding material is comprised of three layers of cladding material.

10. The method of claim 1, wherein said at least one layer of cladding material is comprised of three layers of cladding material and wherein said step of performing at least one first epitaxial deposition process to form at least one layer of epi semiconductor cladding material around an exposed portion of said fin comprises:
performing a first epitaxial deposition process to form a first layer of epi semiconductor material on an exposed portion of said fin;
performing a second epitaxial deposition process to form a second layer of epi semiconductor material on said first layer of epi semiconductor material; and
performing a third epitaxial deposition process to form a third layer of epi semiconductor material on said second layer of epi semiconductor material.

11. The method of claim 10, wherein said substrate and said second layer of epi semiconductor material are comprised of silicon and said first and third layers of epi semiconductor material are comprised of silicon germanium.

12. The method of claim 10, wherein said first and third layers of epi semiconductor material are made of the same semiconductor material.

13. A method, comprising:
forming a fin in a semiconductor substrate;
performing at least one first epitaxial deposition process to form at least one layer of epi semiconductor cladding material around an exposed portion of said fin;
performing at least one etching process to pattern said at least one layer of cladding material and said fin, thereby resulting in a patterned portion of said fin being positioned under the patterned said at least one layer of cladding material, said patterned at least one layer of cladding material having an upper portion and a plurality of substantially vertically oriented legs extending downward from said upper portion;
performing at least one etching process to selectively remove said patterned fin relative to said patterned at least one layer of cladding material and thereby form an opening under said patterned at least one layer of cladding material;
forming a sacrificial gate structure all around said upper portion of said at least one layer of cladding material and a first portion of each of said substantially vertically oriented legs positioned adjacent said upper portion;
with said sacrificial gate structure in position, performing a second epitaxial deposition process to form an epi semiconductor source/drain region on a second portion of each of said substantially vertically oriented legs;
removing said sacrificial gate structure;
forming a layer of insulating material that is positioned on an upper surface of each of said source/drain regions; and
forming a final gate structure on said layer of insulating material and all around at least a portion of said upper portion of said at least one layer of cladding material.

14. The method of claim 13, wherein, prior to forming said layer of insulating material, the method further comprises:
forming another layer of insulating material so as to overfill said opening under said patterned at least one layer of cladding material; and performing a recess etching process on at least said another layer on insulating material to remove portions of said layer of insulating material and thereby expose said upper portion and said first portion of said substantially vertically oriented legs of said patterned at least one layer of cladding material.

15. The method of claim 13, wherein forming said layer of insulating material comprises depositing said layer of insulating material such that it has an upper surface that is positioned above said upper portion of said at least one layer of cladding material and performing a recess etching process on said layer of insulating material such that, after said recess etching process is completed, at least said upper portion of said at least one layer of cladding material is exposed above said recessed layer of insulating material.

16. The method of claim 13, wherein said at least one layer of cladding material is comprised of a single layer of cladding material.

17. The method of claim 13, wherein said at least one layer of cladding material is comprised of three layers of cladding material.

18. The method of claim 13, wherein said at least one layer of cladding material is comprised of three layers of cladding material and wherein said step of performing at least one first epitaxial deposition process to form said at least one layer of epi semiconductor cladding material around an exposed portion of said fin comprises:
performing a first epitaxial deposition process to form a first layer of epi semiconductor material on an exposed portion of said fin;
performing a second epitaxial deposition process to form a second layer of epi semiconductor material on said first layer of epi semiconductor material; and
performing a third epitaxial deposition process to form a third layer of epi semiconductor material on said second layer of epi semiconductor material.

19. The method of claim 18, wherein said substrate and said second layer of epi semiconductor material are comprised of silicon and said first and third layers of epi semiconductor material are comprised of silicon germanium.

20. The method of claim 18, wherein said first and third layers of epi semiconductor material are made of the same semiconductor material.

21. A device, comprising:
a layer of insulating material;
a nanowire comprised of at least one layer of epi semiconductor material positioned above said layer of insulating material;
a gate structure positioned all around at least a portion of said nanowire and above said layer of insulating material; and
a plurality of epi semiconductor source/drain regions positioned vertically below said layer of insulating material, wherein each of said source/drain regions is vertically spaced apart from said gate structure and wherein said nanowire structure is coupled to said gate structure and each of said source/drain regions.

22. The device of claim 21, wherein said at least one layer of epi semiconductor material is comprised of one of silicon SiGe, a III-V material, InGaAs, GaAs, InAs, GaSb, or InSbAs.

23. The device of claim 21, further comprising another layer of insulating material that is positioned under said layer of insulating material and between each of said epi source/drain regions.

24. The device of claim 21, wherein said at least one layer of epi semiconductor material is a single layer of epi semiconductor material.

25. The device of claim 21, wherein said at least one layer of epi semiconductor material comprises a first layer of epi semiconductor material, a second layer of epi semiconductor material positioned on said first layer of epi semiconductor material and a third layer of epi semiconductor material positioned on said second layer of epi semiconductor material.

26. The device of claim 25, wherein said substrate and said second layer of epi semiconductor material are comprised of silicon and said first and third layers of epi semiconductor material are comprised of silicon germanium.

27. The device of claim 25, wherein said first and third layers of epi semiconductor material are made of the same semiconductor material.

* * * * *